United States Patent
Lo

(10) Patent No.: US 11,482,474 B2
(45) Date of Patent: Oct. 25, 2022

(54) FORMING A SELF-ALIGNED TSV WITH NARROW OPENING IN HORIZONTAL ISOLATION LAYER INTERFACING SUBSTRATE

(71) Applicant: NANYA TECHNOLOGY CORPORATION, New Taipei (TW)

(72) Inventor: Yi-Jen Lo, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 193 days.

(21) Appl. No.: 17/033,904

(22) Filed: Sep. 27, 2020

(65) Prior Publication Data

US 2022/0102244 A1    Mar. 31, 2022

(51) Int. Cl.
*H01L 23/48* (2006.01)
*H01L 21/768* (2006.01)

(52) U.S. Cl.
CPC ...... *H01L 23/481* (2013.01); *H01L 21/76898* (2013.01); *H01L 2225/06541* (2013.01)

(58) Field of Classification Search
CPC ......... H01L 21/76898; H01L 21/76807; H01L 23/481; H01L 2225/06541
See application file for complete search history.

(56) References Cited

U.S. PATENT DOCUMENTS

| | | | |
|---|---|---|---|
| 2009/0061634 A1* | 3/2009 | Feurprier | H01L 21/76814 438/700 |
| 2012/0168915 A1* | 7/2012 | Du | H01L 21/7682 438/689 |
| 2015/0179546 A1* | 6/2015 | Wakiyama | H01L 21/30604 438/455 |
| 2017/0053872 A1* | 2/2017 | Lee | H01L 21/76879 |

* cited by examiner

*Primary Examiner* — Herve-Louis Y Assouman
(74) *Attorney, Agent, or Firm* — CKC & Partners Co., LLC

(57) ABSTRACT

A semiconductor device and method of manufacturing thereof are provided. The semiconductor device includes a substrate, a first dielectric layer, an isolation layer, a conductor and a liner layer. The substrate has a top surface and a bottom surface opposite the top surface. The first dielectric layer is on the bottom surface of the substrate, in which the first dielectric layer comprises an interconnect structure disposed therein. The isolation layer is on the top surface of the substrate. The conductor is disposed in the substrate and covers a portion of the isolation layer, in which the conductor includes a first portion connected to the interconnect structure and a second portion on the first portion, in which the first portion has a width greater than a width of the second portion. The liner layer is disposed between the substrate and the conductor.

17 Claims, 11 Drawing Sheets

FORMING A SELF-ALIGNED TSV WITH NARROW OPENING IN HORIZONTAL ISOLATION LAYER INTERFACING SUBSTRATE

BACKGROUND

Field of Invention

The present invention relates to a semiconductor device and method of manufacturing thereof. More particularly, the present invention relates to a semiconductor device having a through silicon via.

Description of Related Art

With the progress of technology, nowadays consumers pay more attention to characteristics of portable electronic products such as size, integrity and efficiency. This also elevates the needs of the miniaturization of semiconductors and cost reduction in manufacturing processes. three-dimension (3D) IC technology has been developed in recent years, in which semiconductor chips could be vertically stacked by techniques such as bonding or packaging, and through silicon vias are utilized to connect chips in each layer. The through silicon via may provide a vertically conducting path, and may have advantages such as increasing the stacked density of chips, elevating efficiency of products and lowering energy consumption. Therefore, by utilizing 3D IC technology, higher integrity and efficiency may be realized in small volume products.

However, in the conventional manufacturing process of the through silicon via, isolation layer (especially on the top) between the substrate and the through silicon via may be loss, and thereby exposing the TSV to the surrounding substrate. The defect in the isolation layer may lead to leakage issue. Such leakage may result in significantly reduce IC performance and/or circuit yield, and can also lead to degraded reliability of the IC.

SUMMARY

In accordance with an aspect of the present disclosure, a method of manufacturing a semiconductor device is provided. The method includes providing a substrate having a top surface. An isolation layer is then formed on the top surface of the substrate. An opening is then formed in the isolation layer to expose a portion of the top surface of the substrate. A through hole penetrating the substrate is then formed, in which a sidewall of the substrate is recessed from a sidewall of the isolation layer. A liner layer is then formed on the sidewall of the substrate, in which the liner layer has a sidewall recessed from the sidewall of the isolation layer. A conductor is then formed in the opening and the through hole.

According to some embodiments of the present disclosure, the method further includes forming a first dielectric layer on a bottom surface opposite the top surface of the substrate, in which the first dielectric layer comprises an interconnect structure therein.

According to some embodiments of the present disclosure, before forming the opening in the isolation layer, the method further includes forming a second dielectric layer on the isolation layer, in which the second dielectric layer has an opening exposing a portion of a top surface of the isolation layer.

According to some embodiments of the present disclosure, the opening of the second dielectric layer has a width greater than a width of the opening of the isolation layer.

According to some embodiments of the present disclosure, forming the liner layer on the sidewall of the substrate includes forming a liner isolation in the through hole and on the isolation layer. A portion of the liner isolation is then removed to expose the sidewall of the isolation layer.

According to some embodiments of the present disclosure, the method further includes forming a barrier layer in the through hole.

According to some embodiments of the present disclosure, forming the conductor in the opening and the through hole includes filling the opening and the through hole with a conductive material. A planarization process is then performed on the conductive material to remove excess portions of the conductive material over the isolation layer.

According to some embodiments of the present disclosure, the conductor includes a first portion below the isolation layer and a second portion on the first portion, in which the first portion has a width greater than a width of the second portion.

According to some embodiments of the present disclosure, a ratio of the width of the first portion to the width of the second portion is of about 1.1-1.5.

In accordance with another aspect of the present disclosure, a semiconductor device is provided. The semiconductor device includes a substrate, a first dielectric layer, an isolation layer, a conductor and a liner layer. The substrate has a top surface and a bottom surface opposite the top surface. The first dielectric layer is on the bottom surface of the substrate, in which the first dielectric layer comprises an interconnect structure disposed therein. The isolation layer is on the top surface of the substrate. The conductor is disposed in the substrate and covers a portion of the isolation layer, in which the conductor includes a first portion connected to the interconnect structure and a second portion on the first portion, in which the first portion has a width greater than a width of the second portion. The liner layer is disposed between the substrate and the conductor.

According to some embodiments of the present disclosure, the isolation layer has a sidewall protruding from a sidewall of the liner layer.

According to some embodiments of the present disclosure, the isolation layer is laterally protruded into the conductor.

According to some embodiments of the present disclosure, a ratio of the width of the first portion to the width of the second portion is of about 1.1-1.5.

According to some embodiments of the present disclosure, further includes a second dielectric layer disposed on the isolation layer.

According to some embodiments of the present disclosure, the conductor has a third portion disposed on the second portion and embedded in the second dielectric layer.

According to some embodiments of the present disclosure, the third portion has a width greater the width of the first portion and the width of the second portion.

According to some embodiments of the present disclosure, the third portion of the conductor has a top surface level with a top surface of the second dielectric layer.

According to some embodiments of the present disclosure, further includes a barrier layer between the liner layer and the conductor.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
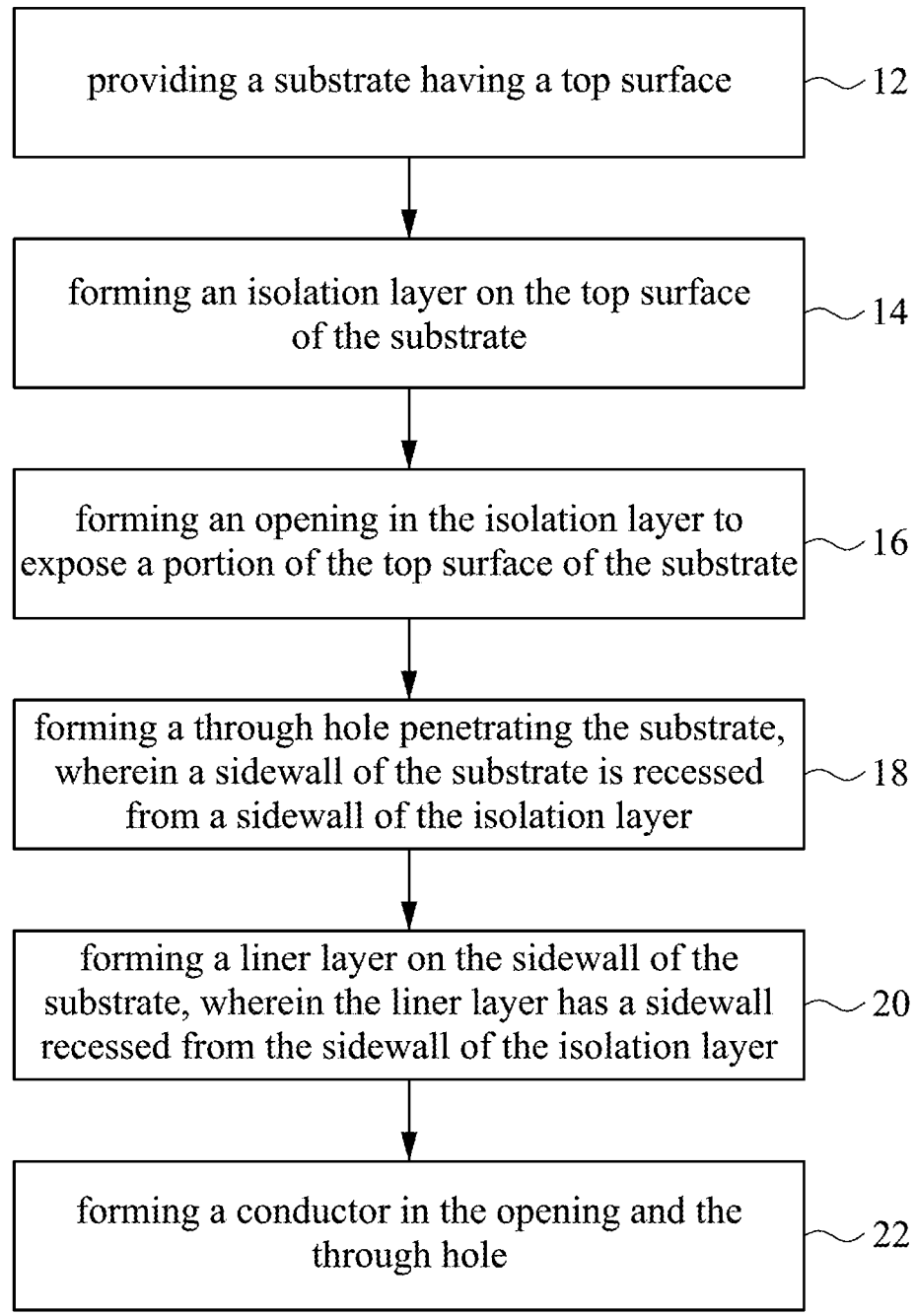
FIG. 1 is a flow chart illustrating a method of manufacturing a semiconductor device in accordance with some embodiments of this disclosure.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a flow chart illustrating a method 10 of manufacturing a semiconductor device in accordance with some embodiments of this disclosure. The method 10 includes operation 12, operation 14, operation 16, operation 18, operation 20 and operation 22. It is noted that the method depicted in FIG. 1 is merely an example, and is not intended to limit the present invention. Accordingly, additional operations may be performed before, during, and/or after the method depicted in FIG. 1, and some other operations may only be briefly described herein. FIGS. 2-11 are cross-sectional views of various intermediary stages in the manufacturing of semiconductor device 1000 according to the method 10 of FIG. 1.

Figure 2:
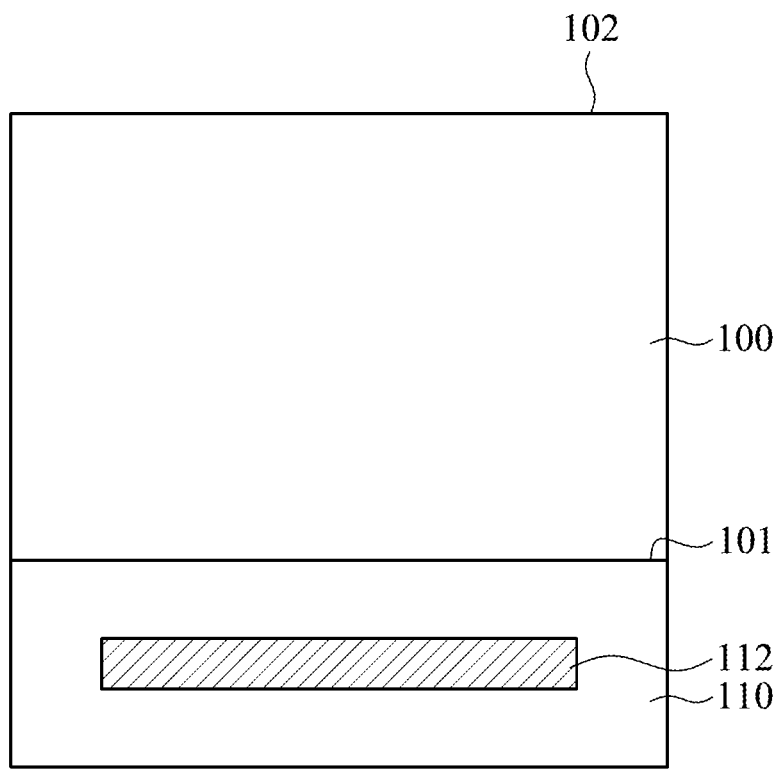
FIG. 2 to FIG. 11 are top views of various intermediary stages in the manufacturing of semiconductor device in accordance with some embodiments of this disclosure.

Reference is made to FIG. 1 and FIG. 2. In the operation 12 of FIG. 1, a substrate 100 having a top surface 102 is provided. The substrate 100 may be a part of wafer. In some embodiments, the substrate 100 includes an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrate 100 may also include a silicon-on-insulator (SOI) substrate. Generally, an SOI substrate includes a layer of a semiconductor material such as silicon (Si), germanium (Ge), silicon germanium (SiGe), silicon germanium on insulator (SGOI), or a combination thereof.

As shown in FIG. 2, the substrate 100 has a top surface 102 and a bottom surface 101 opposite the top surface 102. A first dielectric layer 110 is formed on the bottom surface 101 of the substrate 100. The first dielectric layer 110 includes an interconnect structure 112 therein. In some embodiments, the interconnect structure 112 includes copper (Cu), Aluminum (Al), or tungsten (W), but is not limited thereto. The interconnect structure 112 embedded in the first dielectric layer 110 includes metal lines, metal pads, and/or vias. In some embodiments, active devices such as transistors (not shown) may be further formed on the bottom surface 101 of the substrate 100. The interconnect structure 112 may be electrically connected to the active devices.

Figure 3:
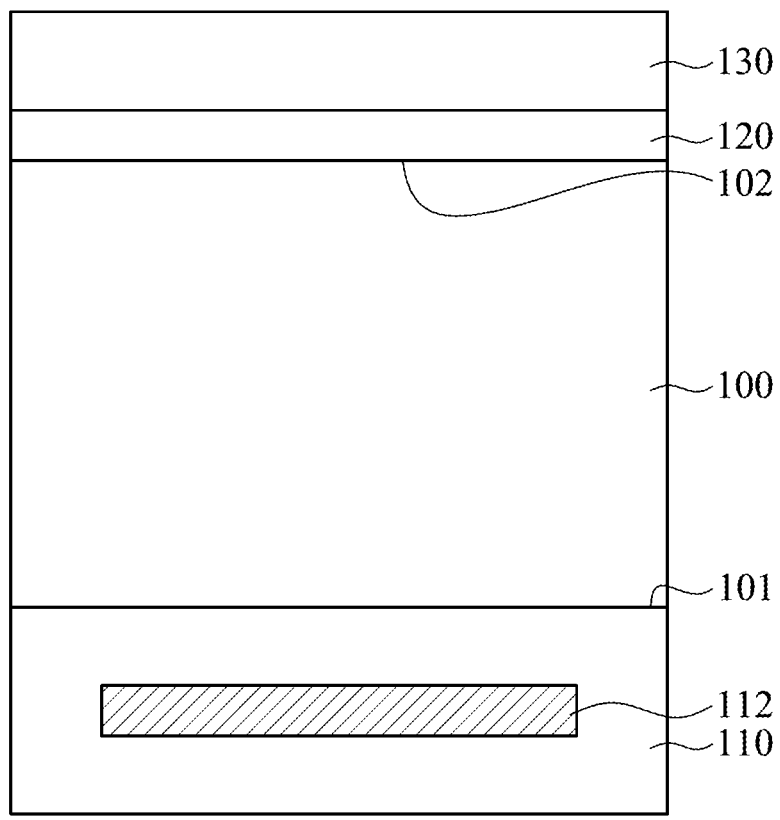

Reference is made to FIG. 1 and FIG. 3. In the operation 14 of FIG. 1, an isolation layer 120 is formed on the top surface 102 of the substrate 100. In some embodiments, the isolation layer 120 includes dielectric materials such as silicon nitride, silicon oxide, but is not limited thereto. The isolation layer 120 may be functioned as a hard mask in the following operations. In some embodiments, the isolation layer 120 is formed by using a deposition method such as chemical vapor deposition (CVD). In other embodiments, the isolation layer 120 is formed through thermal oxidation of substrate 100. As shown in FIG. 3, a second dielectric layer 130 is further formed on the isolation layer 120. In some embodiments, the second dielectric layer 130 includes dielectric material such as silicon oxide, but is not limited thereto. The second dielectric layer 130 may have etching selectivity higher than the isolation layer 120. In some embodiments, the second dielectric layer 130 is formed by suitable deposition method such as chemical vapor deposition. In some examples, the second dielectric layer includes material same as the first dielectric layer 110.

Figure 4:
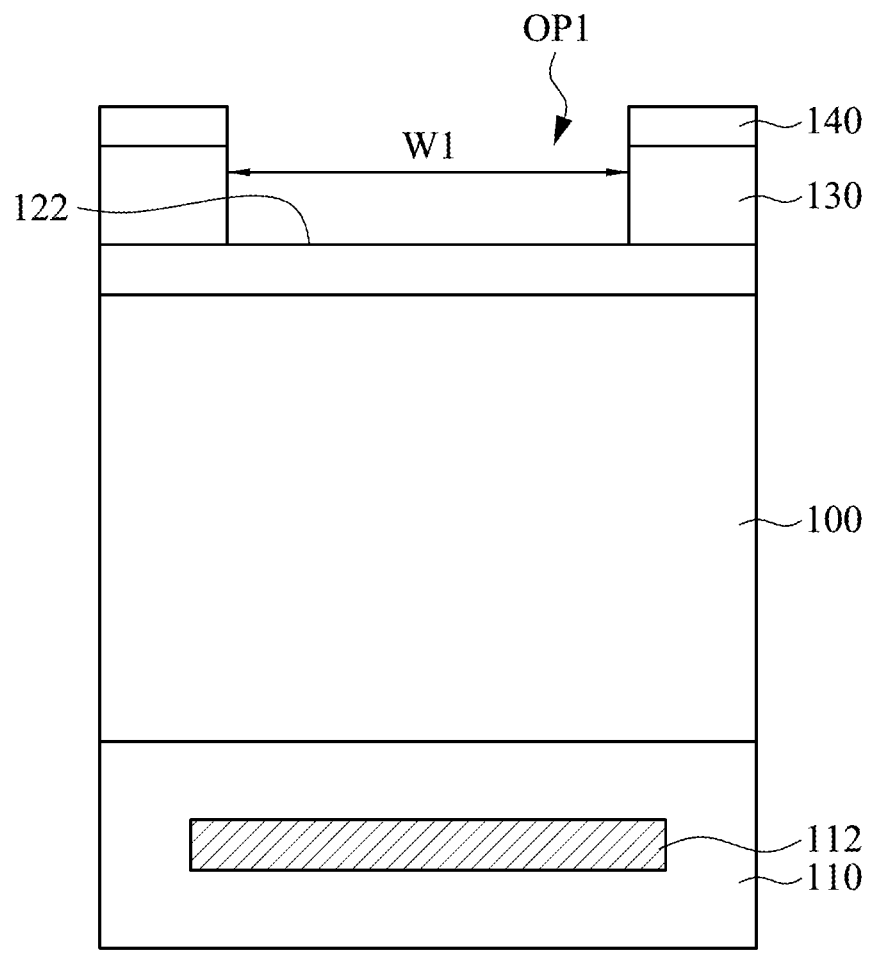

Referring to FIG. 4, an opening OP1 is formed in the second dielectric layer 130 to expose a portion of a top surface 122 of the isolation layer 120. Specifically, a patterned photoresist layer 140 may be formed on the second dielectric layer 130 to expose a top surface of a second dielectric layer 130. The exposed second dielectric layer 130 is then etched to form the opening OP1 in the second dielectric layer 130. As shown in FIG. 4, the opening OP1 has a width W1. In some embodiments, the patterned photoresist layer 140 is removed after forming the opening OP1.

Figure 5:
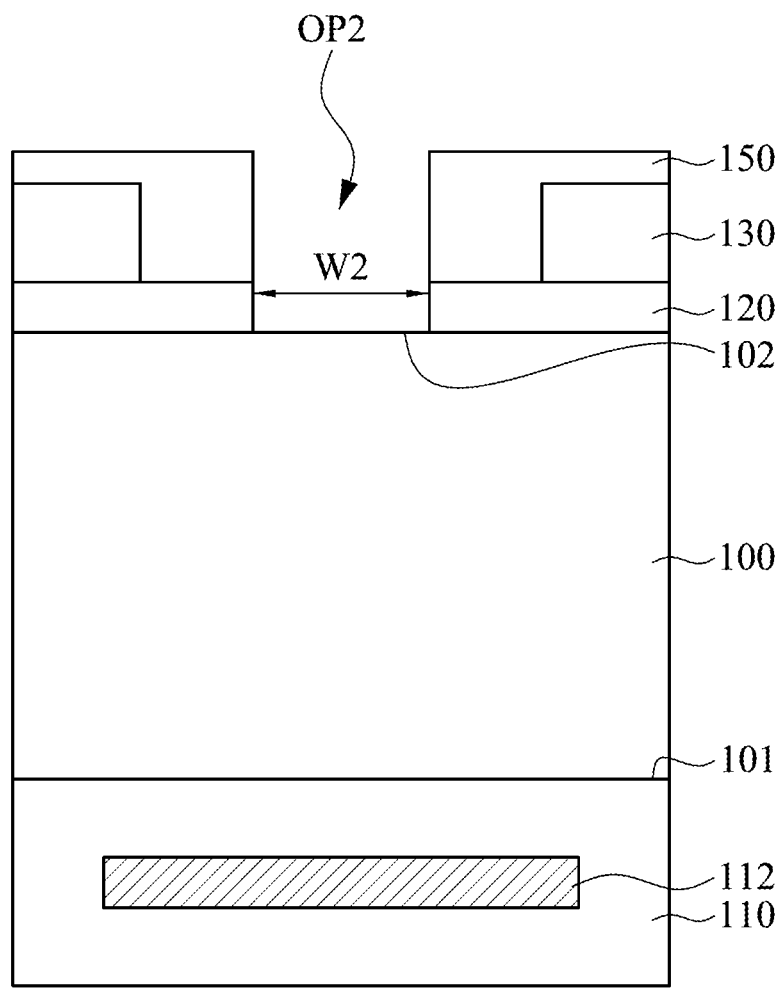

Reference is made to FIG. 1 and FIG. 5. In the operation 16 of FIG. 1, an opening OP2 is formed in the isolation layer 120 to expose a portion of the top surface 102 of the substrate 100. Specifically, a patterned photoresist layer 150 may be formed on the second dielectric layer 130 and the isolation layer 120 to expose a portion of the top surface 122 (shown in FIG. 4) of the isolation layer 120. The exposed isolation layer 120 is then removed to form the opening OP2 in the isolation layer 120. As shown in FIG. 5, the opening OP2 has a width W2. The opening OP2 has a width W2 smaller than the width W1 of the opening OP1 (shown in FIG. 4). In some embodiments, the patterned photoresist layer 150 is removed after forming the opening OP2.

Figure 6:
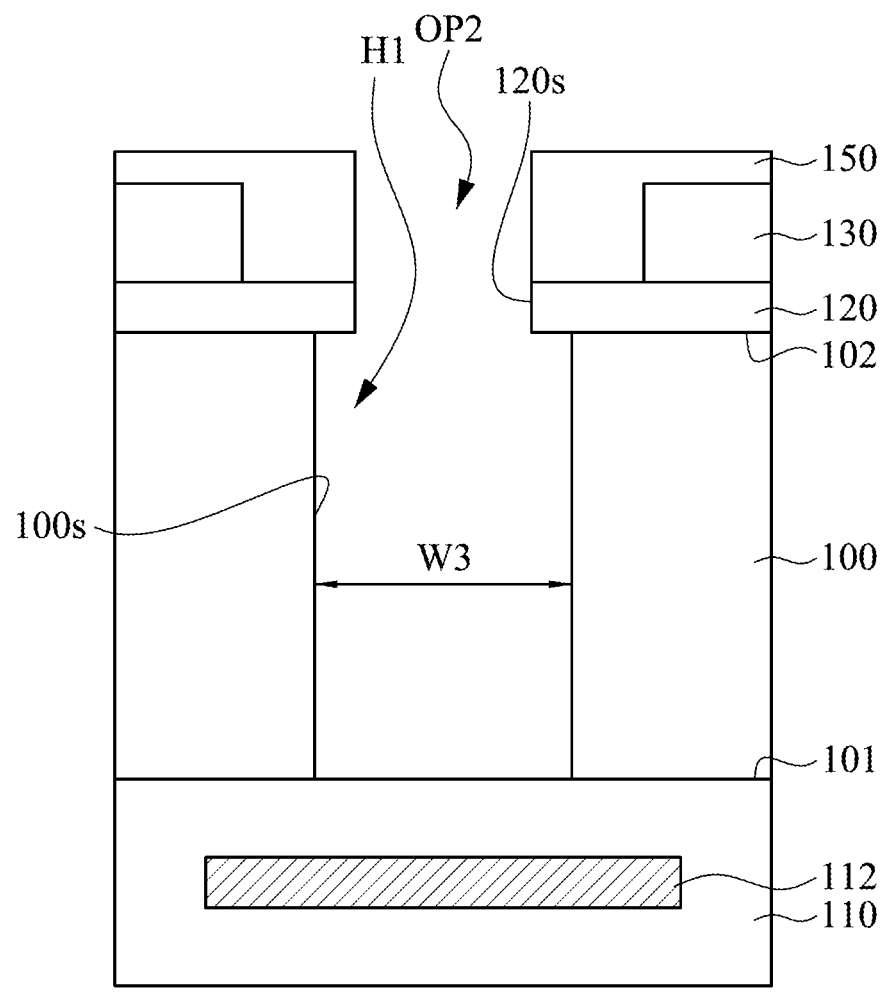

Reference is made to FIG. 1 and FIG. 6. In the operation 18 of FIG. 1, a through hole H1 is formed penetrating the substrate 100, in which a sidewall 100s of the substrate 100 is recessed from a sidewall 120s of the isolation layer 120. The through hole H1 extends from the top surface 102 to the bottom surface 101 of the substrate 100. Specifically, the through hole H1 communicates with the opening OP2 and exposes a top surface of the first dielectric layer 110. An edge of the substrate 100 is pull back by etching the substrate 100, so as to recess the substrate 100 and expose a portion of bottom surface of the isolation layer 120. The through hole H1 has a width W3. In some embodiments, the width W3 of the through hole H1 is greater than the width W1 of the opening OP1 shown in FIG. 4 and the width W2 of the opening OP2. In some embodiments, a ratio of the width W3 of the through hole H1 to the width W2 of the opening OP2 is of about 1.1-1.5. For example, the ratio may be 1.2, 1.3, or 1.4. In some embodiments, the through hole H1 is formed by dry etching method or wet etching method. For example, the substrate 100 exposed by the opening OP2 (shown in FIG. 5) is etched by using $SF_6$. The patterned photoresist layer 150 may be removed after forming the through hole H1.

Figure 7:
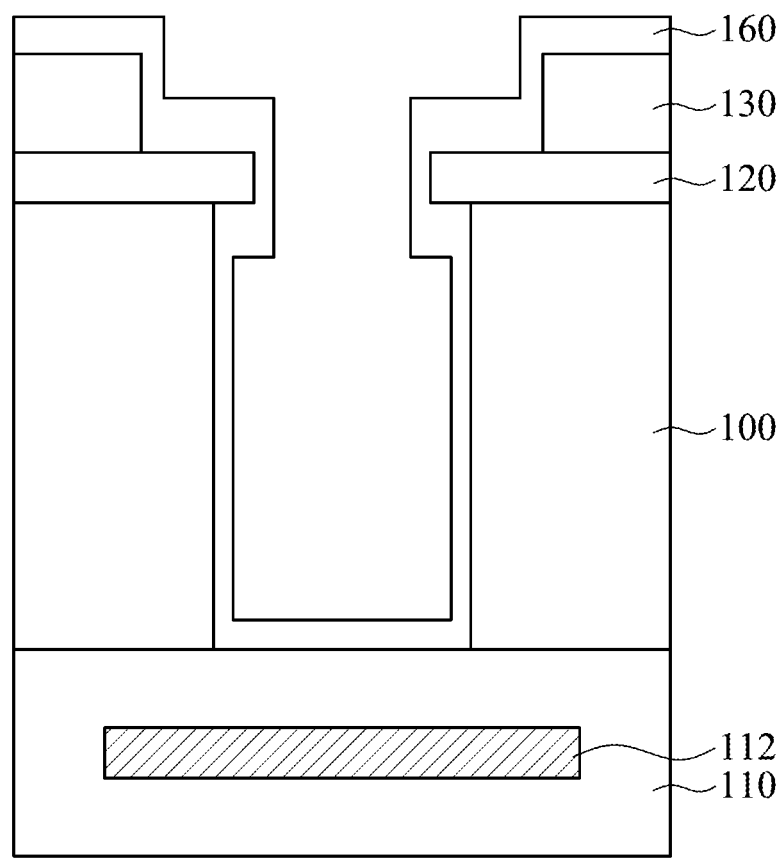
Figure 8:
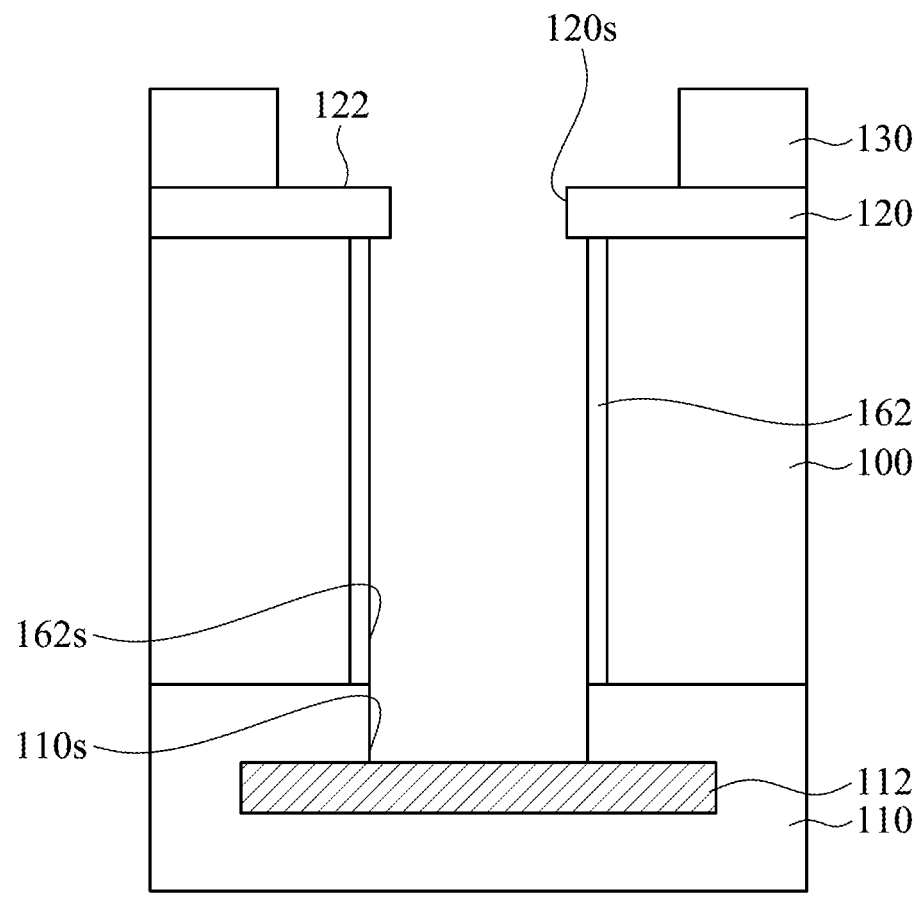

Reference is made to FIG. 1 and FIG. 8. In the operation 20 of FIG. 1, a liner layer 162 is formed on the sidewall 100s of the substrate 100, in which the liner layer 162 has a sidewall 162s recessed from the sidewall 120s of the isolation layer 120. FIGS. 7-8 illustrate the detail steps of implementing operation 20 in accordance with an embodiment of the present disclosure.

Referring to FIG. 7, a liner isolation 160 is formed in the through hole H1 and on the isolation layer 120. Specifically, the liner isolation 160 is formed to cover the second dielectric layer 130, the isolation layer 120, the sidewall 100s of the substrate 100 and the exposed top surface of the first dielectric layer 110. In some embodiments, the liner isolation 160 includes oxide material, but is not limited thereto. In some examples, the material of the liner isolation 160 may be same as that of the second dielectric layer 130. In some embodiments, the liner isolation 160 is formed by suitable deposition method such as atomic layer deposition (ALD).

Referring to FIG. 8, a portion of the liner isolation 160 and a portion of the first dielectric layer 110 are further removed to form the liner layer 162. In some embodiments, the portion of the liner isolation 160 and the portion of the first dielectric layer 110 are removed by dry etching method. For example, using $CF_4$ to etch the liner isolation 160 on the sidewall 120s of the isolation layer 120 and on a bottom of the through hole H1 (shown in FIG. 6), and the first dielectric layer 110 under the through hole H1. The dry etching process may be stopped until exposing the interconnect structure 112 in the first dielectric layer 110. In some embodiments, the sidewall 162s of the liner layer 162 may be aligned with a sidewall 110s of the first dielectric layer 110. Since the isolation layer 120 is protruded from the sidewall 100s of the substrate 100 (shown in FIG. 6), the isolation layer 120 can protect the adjacent liner layer 162 during the etching process. Therefore, the liner layer 162 may have an substantially uniform thickness from its bottom to the top.

Figure 9:
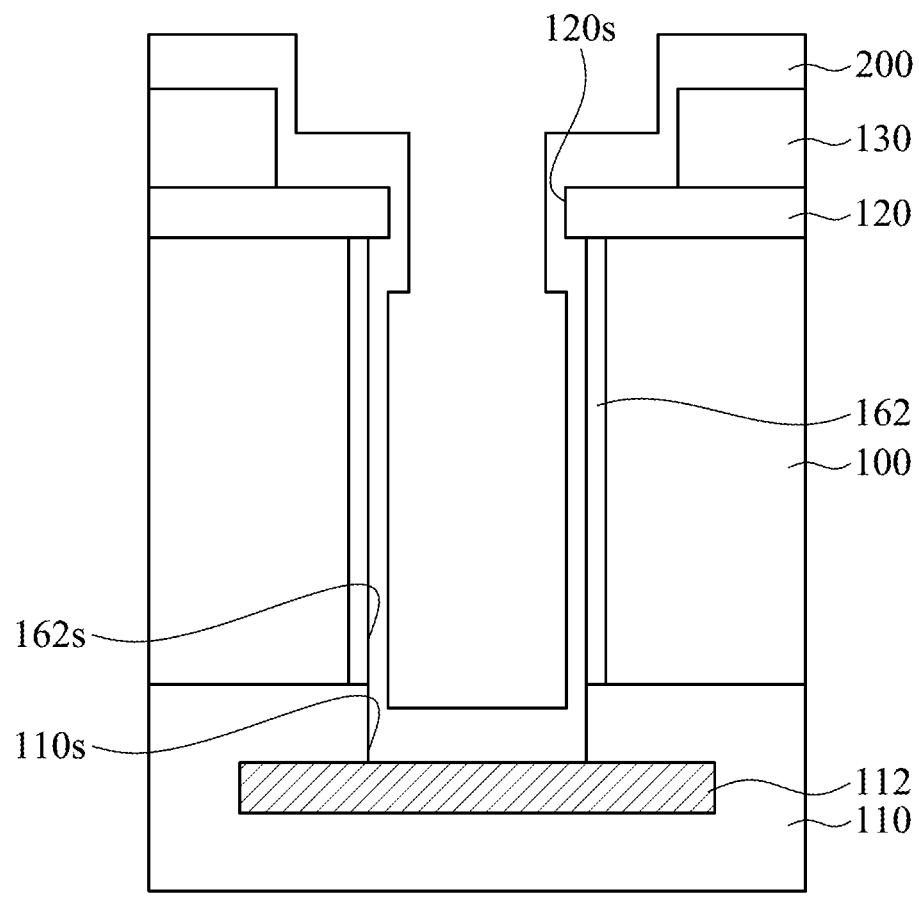

Reference is made to FIG. 9. A barrier layer 200 is further formed on the liner layer 162. Specifically, the barrier layer 200 continuously extends from a top surface of the second dielectric layer 130 to the exposed interconnect structure 112. That is, the barrier layer 200 is formed covering the second dielectric layer 130, the isolation layer 120, the sidewall 162s of the liner layer 162, the sidewall 110s of the first dielectric layer 110, and the exposed interconnect structure 112. As shown in FIG. 9, the barrier layer 200 is in contact with the interconnect structure 112. In some embodiments, the barrier layer 200 includes titanium, titanium nitride, tantalum, tantalum nitride, or combinations thereof, but is not limited thereto. In some embodiments, the barrier layer 200 is formed by suitable deposition method such a physical vapor deposition (PVD), but is not limited thereto. In some embodiments, a seed layer (not shown) is further formed on the barrier layer 200.

Figure 10:
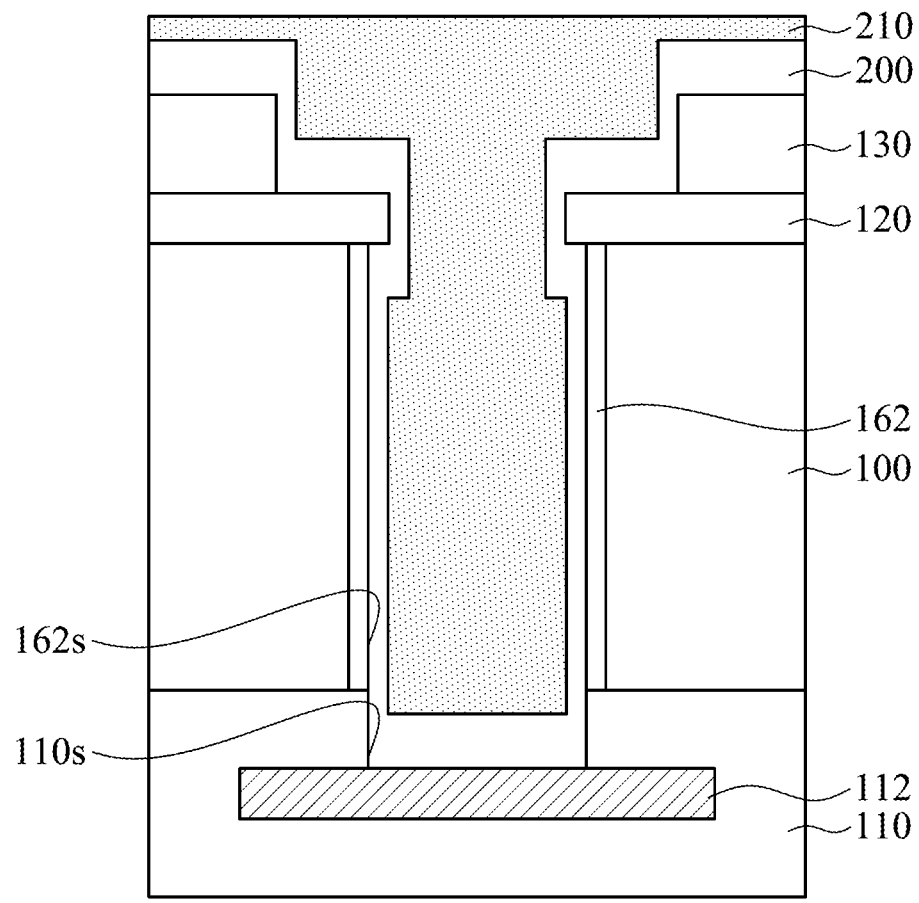
Figure 11:
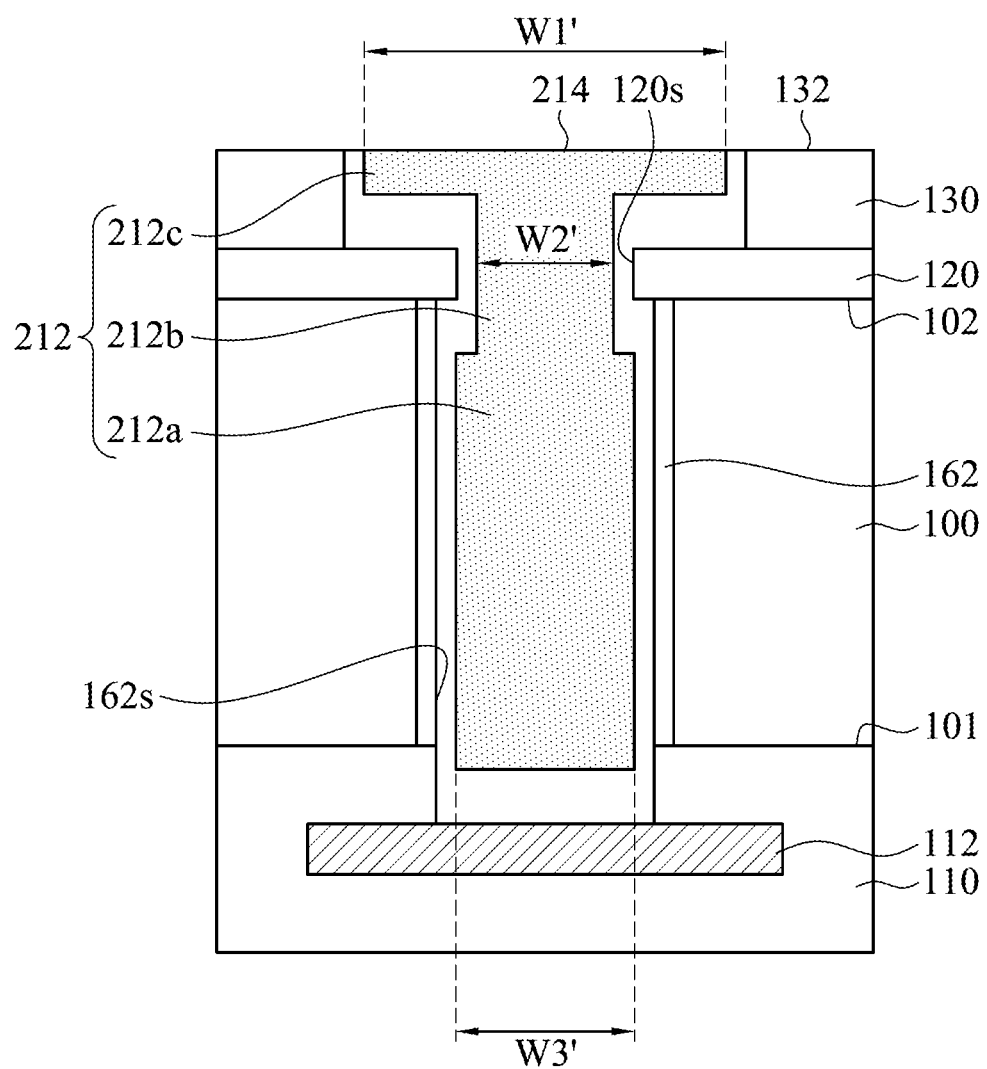

Reference is made to FIG. 1 and FIG. 11. In the operation 22 of FIG. 1, a conductor 212 is formed in the opening OP2 and the through hole H1. FIGS. 10-11 illustrate the detail steps of implementing operation 22 in accordance with an embodiment of the present disclosure.

Referring to FIG. 10, a conductive material 210 is formed on the barrier layer 200. Specifically, the opening OP1 (shown in FIG. 4), the opening OP2 and the through hole H1 (shown in FIG. 6) are filled with a conductive material 210. In some embodiments, the conductive material 210 includes copper, poly silicon or tungsten, but is not limited thereto. In some embodiments, the conductive material 210 is formed by electro-chemical plating (ECP). The conductive material 210 can be plated to a level higher than a top surface of the second dielectric layer 130.

Referring to FIG. 11, a planarization process is then performed on the conductive material 210 to form the conductor 212. In some embodiments, the planarization process includes chemical mechanical polish (CMP), but is not limited thereto. Excess portions of the conductive material 210 over the second dielectric layer 130 are removed, such that a top surface 214 of the conductor 212 is level with a top surface 132 of the second dielectric layer 130. As such, the semiconductor device 1000 is formed.

As shown in FIG. 11, the semiconductor device 1000 includes the substrate 100, the first dielectric layer 110, the isolation layer 120, the conductor 212 and the liner layer 162. The first dielectric layer 110 is disposed on the bottom surface 101 of the substrate 100, in which the interconnect structure 112 is disposed therein. The isolation layer 120 is disposed on the top surface 102 of the substrate 100. In some embodiments, the isolation layer 120 is laterally protruded into the conductor 212. Specifically, the sidewall 120s of the isolation layer 120 is protruded from the sidewall 162s of the liner layer 162.

The conductor 212 is disposed in the substrate 100 and covers a portion of the isolation layer 120. Specifically, the conductor 212 is embedded in the substrate 100, the isolation layer 120 and the second dielectric layer 130. The conductor 212 is electrically connected to the interconnect structure 112 in the first dielectric layer 110. As shown in FIG. 11, the conductor 212 includes a first portion 212a and a second portion 212b. The first portion 212a is located on a bottom of the conductor 212 and connected to the interconnect structure 112. Specifically, the first portion 212a is disposed below the isolation layer 120. The second portion 212b of the conductor 212 is disposed on the first portion 212a. A width W3' of the first portion 212a is greater than a width W2' of the second portion 212b. In some embodiments, a ratio of the width W3' of the first portion 212a to the width W2' of the second portion 212b is of about 1.1-1.5. For example, the ratio may be 1.2, 1.3, or 1.4. In some embodiments, the conductor 212 further includes a third portion 212c located on the second portion 212b. The third portion 212c of the conductor 212 is embedded in the second dielectric layer 130. In some embodiments, the third portion 212c of the conductor 212 is electrically connected to a redistribution layer (RDL), or a bump (not shown). In some embodiments, the third portion 212c has a width W1' that is greater than the width W3' of the first portion 212a and the width W2' the second portion 212b. Specifically, the first portion 212a, the second portion 212b and the third portion 212c of the conductor 212 may have different horizontal dimensions.

Still refer to FIG. 11. The liner layer 162 is disposed between the substrate 100 and the conductor 212 to separate the conductor 212 from the substrate 100. In some embodiment, a thickness of the liner layer 162 on top (i.e. adjacent to the isolation layer 120) is substantially equal to a thickness of the liner layer 162 on bottom (i.e., adjacent to the first dielectric layer 110) to insulate the substrate 100 and the conductor 212. Therefore, a leakage issue between the conductor 212 and the surrounding substrate 100 can be prevented, and a performance of the semiconductor device 1000 can be improved. In some embodiments, the barrier layer 200 is further disposed between the liner layer 162 and the conductor 212. Specifically, the barrier layer 200 wraps the conductor 212 and is connected to the interconnect structure 112.

As described above, according to the embodiments of the present disclosure, a semiconductor device and a method of manufacturing thereof are provided. The semiconductor device includes a substrate, an isolation layer and a dielectric layer respectively on a top surface and a bottom surface of the substrate, a conductor in the substrate and a liner layer between the conductor and the substrate. In the manufacturing of the semiconductor device of the present disclosure, the isolation layer is formed protruded from a sidewall of the substrate. The protruded isolation layer can prevent the damage of the underlying liner layer during removing a portion of the dielectric layer to expose an interconnect structure embedded therein. Therefore, the thickness of the liner layer on the sidewall of the substrate may be uniform from its bottom to top, which prevents a leakage issue between the conductor and the surrounding substrate. The semiconductor device of the present disclosure can obtain improved electric property and performance.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor device, comprising:
   providing a substrate having a top surface;
   forming an isolation layer on the top surface of the substrate;
   forming an opening in the isolation layer to expose a portion of the top surface of the substrate;
   forming a through hole penetrating the substrate, wherein a sidewall of the substrate is recessed from a sidewall of the isolation layer;
   forming a liner layer on the sidewall of the substrate, wherein the entire liner layer has a sidewall recessed from the sidewall of the isolation layer; and
   forming a conductor in the opening and the through hole, wherein the conductor comprises a first portion below the isolation layer and a second portion on the first portion, wherein the first portion has a width greater than a width of the second portion.

2. The method of claim 1, further comprising forming a first dielectric layer on a bottom surface opposite the top surface of the substrate, wherein the first dielectric layer comprises an interconnect structure therein.

3. The method of claim 1, before forming the opening in the isolation layer, further comprising forming a second dielectric layer on the isolation layer, wherein the second dielectric layer has an opening exposing a portion of a top surface of the isolation layer.

4. The method of claim 3, wherein the opening of the second dielectric layer has a width greater than a width of the opening of the isolation layer.

5. The method of claim 1, wherein forming the liner layer on the sidewall of the substrate comprises:
   forming a liner isolation in the through hole and on the isolation layer; and
   removing a portion of the liner isolation to expose the sidewall of the isolation layer.

6. The method of claim 1, further comprising forming a barrier layer in the through hole.

7. The method of claim 1, wherein forming the conductor in the opening and the through hole comprises:
   filling the opening and the through hole with a conductive material; and
   performing a planarization process on the conductive material to remove excess portions of the conductive material over the isolation layer.

8. The method of claim 1, wherein a ratio of the width of the first portion to the width of the second portion is of about 1.1-1.5.

9. A semiconductor device, comprising:
   a substrate having a top surface and a bottom surface opposite the top surface;
   a first dielectric layer on the bottom surface of the substrate, wherein the first dielectric layer comprises an interconnect structure disposed therein;
   an isolation layer on the top surface of the substrate;
   a conductor disposed in the substrate and covering a portion of the isolation layer, wherein the conductor comprises a first portion connected to the interconnect structure and a second portion on the first portion, wherein the first portion has a width greater than a width of the second portion; and
   a liner layer disposed between the substrate and the conductor.

10. The semiconductor device of claim 9, wherein the isolation layer has a sidewall protruding from a sidewall of the liner layer.

11. The semiconductor device of claim 9, wherein the isolation layer is laterally protruded into the conductor.

12. The semiconductor device of claim 9, wherein a ratio of the width of the first portion to the width of the second portion is of about 1.1-1.5.

13. The semiconductor device of claim 9, further comprising a second dielectric layer disposed on the isolation layer.

14. The semiconductor device of claim 13, wherein the conductor has a third portion disposed on the second portion and embedded in the second dielectric layer.

15. The semiconductor device of claim 14, wherein the third portion has a width greater the width of the first portion and the width of the second portion.

16. The semiconductor device of claim 14, wherein the third portion of the conductor has a top surface level with a top surface of the second dielectric layer.

17. The semiconductor device of claim 9, further comprising a barrier layer between the liner layer and the conductor.

* * * * *